United States Patent
Bradley

(10) Patent No.: US 9,733,289 B1
(45) Date of Patent: Aug. 15, 2017

(54) DEVICES, SYSTEMS, AND METHODS FOR SYCHRONIZING A REMOTE RECEIVER TO A MASTER SIGNAL FOR MEASURING SCATTERING PARAMETERS

(71) Applicant: Anritsu Company, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 725 days.

(21) Appl. No.: 14/022,442

(22) Filed: Sep. 10, 2013

Related U.S. Application Data

(63) Continuation-in-part of application No. 13/957,921, filed on Aug. 2, 2013.

(51) Int. Cl.
*G01R 27/28* (2006.01)
*G01R 27/06* (2006.01)

(52) U.S. Cl.
CPC .................................. *G01R 27/06* (2013.01)

(58) Field of Classification Search
CPC ....................................................... G01R 27/06
USPC .......................................................... 324/638
See application file for complete search history.

(56) References Cited

U.S. PATENT DOCUMENTS

| | | | |
|---|---|---|---|
| 5,524,281 A | 6/1996 | Bradley et al. | |
| 8,278,944 B1 * | 10/2012 | Noujeim | G01R 27/04 324/637 |
| 8,841,923 B1 | 9/2014 | Vanwiggeren | |
| 9,291,657 B2 | 3/2016 | Zaostrovnykh et al. | |
| 2004/0066182 A1 | 4/2004 | Evers et al. | |
| 2007/0171827 A1 | 7/2007 | Scott et al. | |
| 2008/0094072 A1 | 4/2008 | Noujeim | |
| 2012/0128369 A1 * | 5/2012 | Hann | H03L 7/07 398/138 |
| 2015/0077131 A1 | 3/2015 | Incarbone et al. | |

OTHER PUBLICATIONS

Copper Mountain Technologies, Planar R140 Vector Reflectometer, Data Sheet, Jul. 6, 2013.*

(Continued)

*Primary Examiner* — Melissa Koval
*Assistant Examiner* — Courtney McDonnough
(74) *Attorney, Agent, or Firm* — Tucker Ellis LLP

(57) ABSTRACT

A reflectometer for use in measuring scattering (S-)parameters for a device under test (DUT) includes a test port, a radio frequency (RF) output signal source, and a local oscillator (LO) signal. The LO signal is used to downconvert the RF output signal to an incident IF signal. The reflectometer is useable as a first reflectometer with a second reflectometer such that the first and second reflectometers are phase synchronized by a synchronization signal. Phase and magnitude of transmission S-parameters of the DUT are measurable when the first reflectometer is used with the second reflectometer. The roles of the first and second reflectometers are reversible to allow for measurement of forward and reverse parameters. Further, the synchronization signal can be provided by one reflectometer to the other (or both can receive a separately generated synchronization signal) via a wire or fiber optic cable, for example, or via a wireless connection.

20 Claims, 12 Drawing Sheets

(56) References Cited

OTHER PUBLICATIONS

Notice of Allowance issued by United States Patent and Trademark Office on U.S. Appl. No. 13/957,921, mailed May 4, 2016 (13 pages).
Office Action issued by USPTO on U.S. Appl. No. 13/957,921, mailed Apr. 7, 2016, 9 pages.
Copper Mountain Technologies, Vector Reflectometer Planar R140 Preliminary Data Sheet, N.D., 11 pages.

* cited by examiner

DEVICES, SYSTEMS, AND METHODS FOR SYCHRONIZING A REMOTE RECEIVER TO A MASTER SIGNAL FOR MEASURING SCATTERING PARAMETERS

CLAIM OF PRIORITY

The present application is a Continuation-in-Part of U.S. patent application Ser. No. 13/957,921, entitled "DEVICES, SYSTEMS, AND METHODS FOR SYNCHRONIZING A REMOTE RECEIVER TO A MASTER SIGNAL FOR MEASURING SCATTERING PARAMETERS", by Donald Anthony Bradley, filed Aug. 2, 2013, which application is herein incorporated by reference.

TECHNICAL FIELD

The present invention relates to devices and method for synchronizing a remote receiver to a master signal for measuring scattering parameters.

BACKGROUND

Scattering (S-)parameters (the elements of a scattering matrix) describe the electrical behavior of linear electrical networks and devices when undergoing various steady state stimuli by electrical signals. The parameters are useful for electrical engineering, electronics engineering, and communication systems design, including microwave engineering. Many electrical properties of networks of components (inductors, capacitors, resistors) may be expressed using S-parameters, including gain, return loss, voltage standing wave ratio (VSWR), reflection coefficient and amplifier stability. Although applicable at any frequency, S-parameters are mostly used for networks operating at radio frequency (RF) and microwave frequencies where signal power and energy considerations are more easily quantified than currents and voltages. S-parameters change with the measurement frequency, so frequency must be specified for any S-parameter measurements stated, in addition to the characteristic impedance or system impedance.

Vector network analyzers can be used to measure S-parameters, and vary in the number of ports usable to connect with a network or device. The network or device itself can have multiple ports. Vector network analyzers designed for simultaneously measuring the S-parameters of networks or devices with more than two ports are feasible but quickly become prohibitively complex and expensive. Commonly, a single port measurement of the input port voltage reflection coefficient is useful. Combining two single port vector reflectometers can provide flexibility and potentially reduce costs where single port measurements are more commonly obtained, but where multi-port measurements can be beneficial as well.

SUMMARY

In accordance with an embodiment, a reflectometer for use in measuring scattering (S-)parameters for a device under test (DUT) in accordance with the present invention comprises a test port configured to receive signals and selectively transmit signals, a first signal source and a second signal source. The first signal source is selectively connectable with the test port and configured to provide a radio frequency (RF) test signal to the test port. The second signal source is configured to provide a local oscillator (LO) signal to downconvert one or both of a received signal to a reflected intermediate frequency (IF) signal and the RF output signal to an incident IF signal. The reflectometer is adapted to be used as a first reflectometer with a second reflectometer such that the first and second reflectometers are phase synchronized by a synchronization signal. Both phase and magnitude of one or both of an S21 and an S12 parameter of the DUT are measurable when the first reflectometer is used in combination with the second reflectometer.

In an embodiment, the first reflectometer is adapted to be used as a master reflectometer with the second reflectometer used as a slave reflectometer such that the master reflectometer provides the slave reflectometer with the synchronization signal to phase synchronize signals generated by the slave reflectometer to the incident IF signal. Both phase and magnitude of an S21 parameter of the DUT are measurable when the reflectometer is used as the master reflectometer in combination with the slave reflectometer. In an embodiment, the master reflectometer provides the synchronization signal to the slave reflectometer via a cable, for example such as a coaxial cable or a fiber optic cable. In an alternative embodiment, the master reflectometer provides the synchronization signal to the slave reflectometer via a wireless connection. In an embodiment, the synchronization signal is phase synchronized with the incident IF signal and has an amplitude varying with the incident IF signal, and wherein the synchronization signal is obtained from the incident IF signal.

In an embodiment, the first reflectometer and the second reflectometer receive a common signal from a common signal source. A receiver of each of the first and second reflectometers generates the synchronization signal from the common signal. In an embodiment, at least the first reflectometer comprises a base signal source configured to provide a base signal for generating the RF output signal and the LO signal.

In accordance with an embodiment, a system for measuring scattering (S-)parameters for a device under test (DUT) comprises a first reflectometer and a second reflectometer. Both reflectometers include a test port, a first signal source selectively connectable with the test port and configured to provide a radio frequency (RF) test signal to the test port, and a second signal source configured to provide a local oscillator (LO) signal to downconvert one or both of a received signal to a received intermediate frequency (IF) signal and the RF output signal to an incident IF signal. The first reflectometer is adapted to be used with the second reflectometer such that the first and second reflectometers are phase synchronized by a synchronization signal. Both phase and magnitude of one or both of an S21 and an S12 parameter of the DUT are measurable when the first reflectometer is used in combination with the second reflectometer.

In an embodiment, the first reflectometer is adapted to be used as a master reflectometer with the second reflectometer used as a slave reflectometer such that the master reflectometer provides the slave reflectometer with the synchronization signal to phase synchronize signals generated by the slave reflectometer to the incident IF signal. Both phase and magnitude of an S21 parameter of the DUT are measurable when the reflectometer is used as the master reflectometer in combination with the slave reflectometer. In an embodiment, the master reflectometer provides the synchronization signal to the slave reflectometer via a cable, for example such as a coaxial cable or a fiber optic cable. In an alternative embodiment, the master reflectometer provides the synchronization signal to the slave reflectometer via a wireless connection. In an embodiment, the synchronization signal is phase synchronized with the incident IF signal and has an amplitude varying with the incident IF signal, and wherein the synchronization signal is obtained from the incident IF signal.

In an embodiment, the first reflectometer and the second reflectometer receive a common signal from a common signal source. A receiver of each of the first and second reflectometers generates the synchronization signal from the common signal. In an embodiment, at least the first reflectometer comprises a base signal source configured to provide a base signal for generating the RF output signal and the LO signal.

DETAILED DESCRIPTION

Figure 1A:
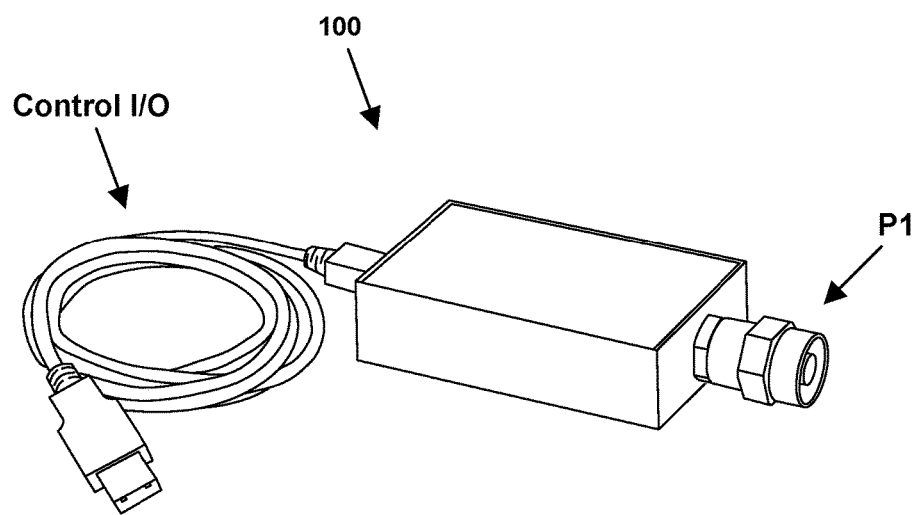
FIG. 1A is a single port reflectometer in accordance with the prior art.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the drawing in which the reference number first appears.

It would be apparent to one of skill in the art that the present invention, as described below, may be implemented in many different embodiments of hardware, software, firmware, and/or the entities illustrated in the figures. Further, the frequencies given for signals generated and/or used in the figures and description are merely exemplary. Any actual software, firmware and/or hardware described herein, as well as any frequencies of signals generated thereby, is not limiting of the present invention. Thus, the operation and behavior of the present invention will be described with the understanding that modifications and variations of the embodiments are possible, given the level of detail presented herein.

Figure 1B:
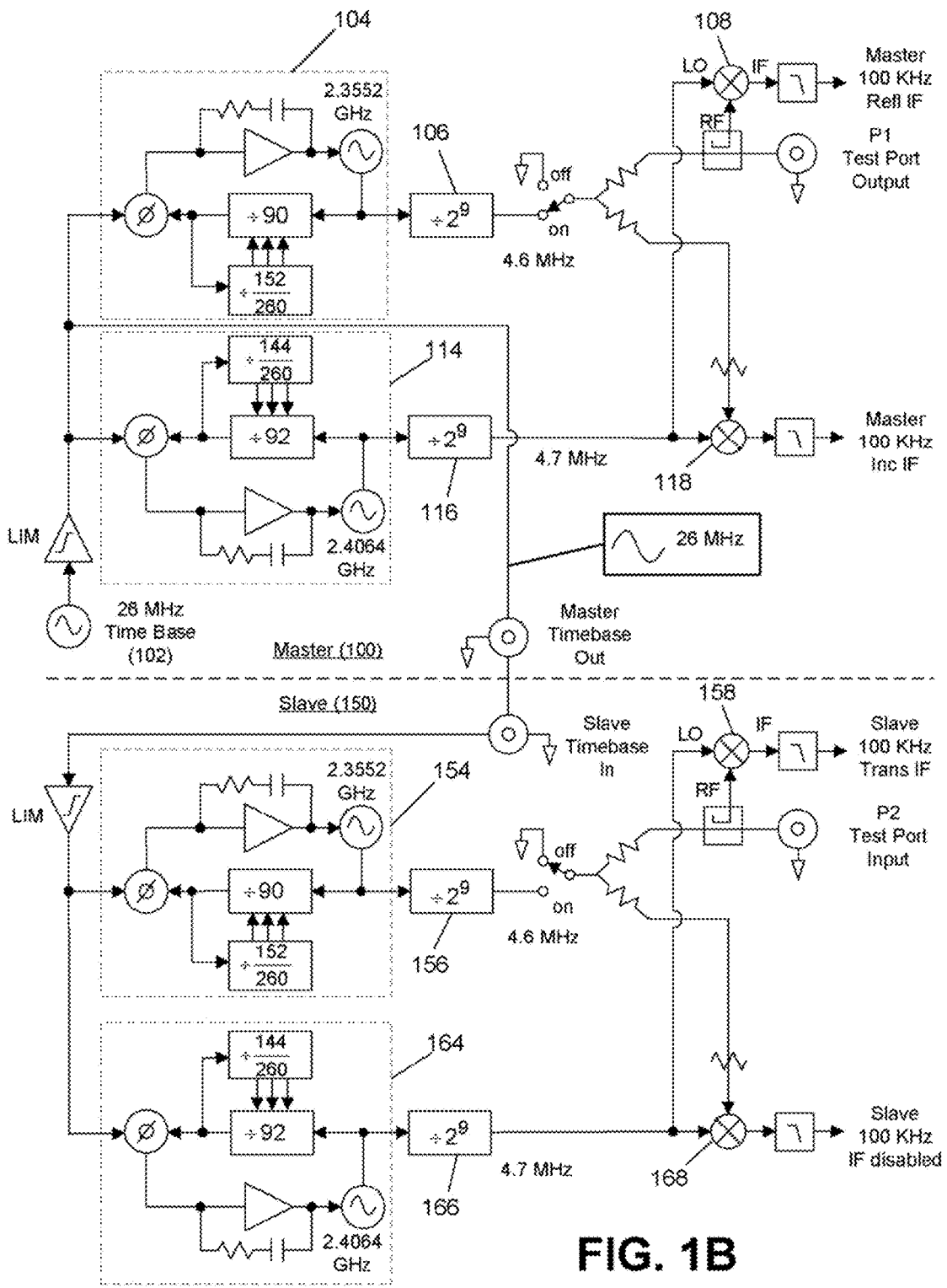
FIG. 1B is a circuit diagram of a system in accordance with the prior art for measuring two port scattering parameters for a device under test.

FIG. 1A illustrates a single port reflectometer 100 in accordance with the prior art for use in measuring electrical performance of a device-under-test (DUT). The reflectometer 100 is connectable with a second reflectometer, for example via a ⅛" diameter, 6' cable with micro coaxial (MCX) connectors (not shown), and controllable via a universal serial bus (USB) cable (Control I/O). FIG. 1B is a circuit diagram of a system including the single port reflectometer 100 in accordance with the prior art for measuring the electrical behavior of a device or network when the device or network is connected with a test port P1 as a DUT. The single port reflectometer 100 includes a time base signal source 102 generating a time base signal that synchronizes a pair of oscillators via respective phase-locked loops (PLLs) 104, 114 to generate a radio frequency (RF) output signal that is transmitted to the test port P1 and a local oscillator (LO) signal that is used to downconvert the RF output signal via a first mixer 118 to generate an incident intermediate frequency (IF) signal. As shown, the time base signal has a frequency of 26 MHz, the RF output signal has a frequency of 4.6 MHz, and the LO signal has a frequency of 4.7 MHz. Synchronization using the time base signal allows the mixer 118 to generate a resulting incident IF signal having a reliable frequency of 100 KHz.

A reflected signal generated at the DUT and reflected back to the test port P1 is coupled to a second mixer 108 and the LO signal is used to downconvert the reflected signal to generate a reflected IF signal. A synchronous detector (not shown) uses the incident and reflected IF signals to measure a scattering (S-)parameter of the DUT. The single port reflectometer 100, when used alone, can measure an S-parameter corresponding to the input port voltage reflection coefficient (also referred to as the S11 parameter). The single port reflectometer 100 can measure magnitude and phase of the input port reflection coefficient.

As further shown in FIG. 1B, the prior art single port reflectometer 100 can be used as a master reflectometer with a second single port reflectometer 150 acting as a slave reflectometer, with both the master and slave reflectometers being connected with a DUT at the respective test ports P1, P2 of the reflectometers. The slave reflectometer 150 receives the time base signal generated by the master reflectometer 100 via a second cable to synchronize the time base frequencies of the two reflectometers 100, 150. The time base synchronization can avoid variation in frequency between different crystal oscillators within the reflectometers which can result, for example, in differences of hundreds of hertz. The time base signal received from the master reflectometer 100 synchronizes a local oscillator via a PLL 164 to generate an LO signal.

The RF source of the slave reflectometer 150 is switched off and an incident IF signal of the slave reflectometer 150 is disabled. The slave reflectometer 150 receives at the second test port P2 the RF output signal transmitted from the first test port P1 to the DUT. The RF output signal is coupled to and downconverted by a mixer 158 using the synchronized LO signal, allowing the measurement of magnitude for an additional S-parameter for the DUT corresponding to the forward voltage gain (i.e., the magnitude portion of the S21 parameter).

Additionally, with the RF source of the master reflectometer 100 switched off and the RF source of the slave reflectometer 150 switched on, the time base signal received from the master reflectometer 100 synchronizes an oscillator via a PLL 154 to generate the RF output signal that is transmitted to the test port P2. The slave reflectometer 150 can be used to measure the phase and magnitude of the reverse reflection coefficient (i.e., the S22 parameter). Further, the master reflectometer 100 can receive at the first test port P1 an RF output signal transmitted from the second test port P2 to the DUT allowing the measurement of magnitude for a third S-parameter corresponding to the reverse voltage gain (i.e., the magnitude portion of the S12 parameter).

Phase information can be obtained for the S11 parameter because the same LO signal is used to downconvert RF signals to generate the incident and reflected IF signals when measuring the S11 parameter. However, the master and slave reflectometer 100, 150 arrangement of FIG. 1B only allows measurement of magnitude for the S21 and S12 parameters. The LO sources of the two reflectometers 100, 150 generate LO signals having predictable frequencies due to the common time base signal, but the phases of the two LO signals are not synchronized, are indeterminable, and can vary because they are generated using different dividers 116, 166, with each divider 116, 166 comprising separate divide-by-two counters. A counter can come up in either state (0 or 1) when turned on. The more signal division, the more ambiguity in the phase state of the LO signal. As a result, phase information for the S21 and S12 parameters cannot be obtained via the arrangement of FIG. 1.

Embodiments of devices, systems, and methods in accordance with the present invention can be used to synchronize a remote receiver to a master signal for measuring both phase and magnitude for two port S-parameters obtained via the remote receiver. Such embodiments can be used to measure both phase and magnitude of the S11 and S22 parameters for a DUT as described above with respect to FIG. 1B. However they also allow the measurement of phase and magnitude for additional S-parameters, rather than measurement of magnitude alone.

Figure 2:
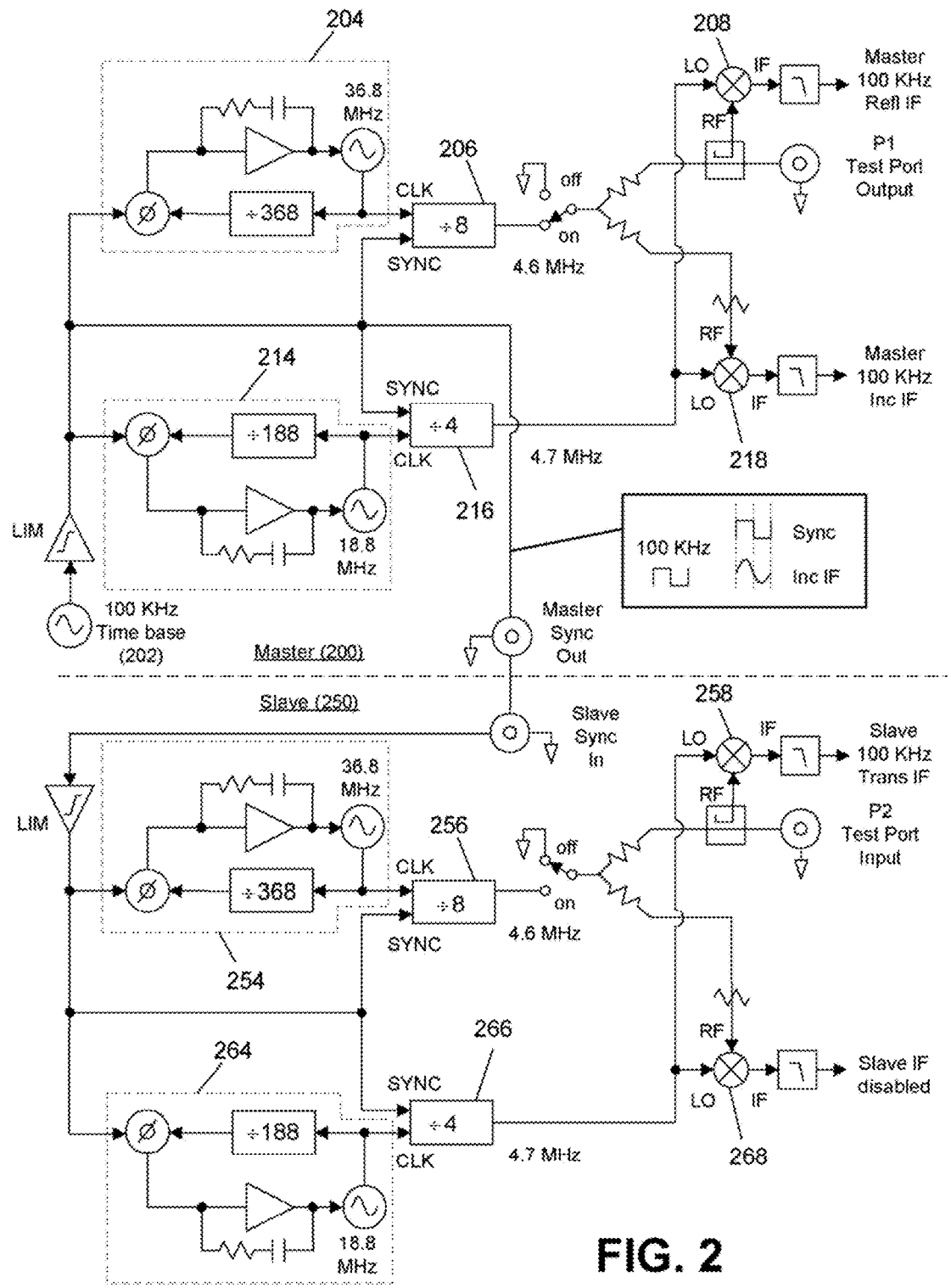
FIG. 2 is a circuit diagram of an embodiment of a system in accordance with the present invention for measuring two port scattering parameters for a device under test.

FIG. 2 is circuit diagram of an embodiment of a system for measuring S-parameters in accordance with the present invention comprising a first single port reflectometer 200 usable as a master reflectometer and a second single port reflectometer 250 usable as a slave reflectometer. An RF source of each of the reflectometers is switchably connectable to and disconnectable from a port P1, P2 so that either reflectometer can act as a transmitter while the other reflectometer acts as a receiver. As shown, the master reflectometer 200 is switched to transmit an RF output signal to a DUT (not shown) connected between the test ports P1, P2 while the slave reflectometer 250 is switched to receive the transmitted signal.

The master reflectometer 200 includes a time base signal source 202 that provides a time base signal usable by both the master reflectometer 200 and the slave reflectometer 250 to synchronize the signals generated by the reflectometers. The time base signal can be passed from the master reflectometer 200 to the slave reflectometer 250 via a cable, for example a coaxial cable having micro coaxial (MCX) connectors. As shown, the time base signal has a frequency of 100 KHz.

When the master reflectometer 200 is switched to act as a transmitter, the time base signal acts as a synchronization (SYNC) signal to a pair of dividers 216, 206 to synchronize an LO signal generated from a clock (CLK) signal provided by a first PLL 214 to an RF output signal generated from a CLK signal provided by a second PLL 204. The RF output signal is downconverted by the synchronized LO signal at a mixer (as shown) 218 to generate an incident IF signal having a predictable phase as well as frequency. As shown, the RF output signal has a frequency of 4.6 MHz, and the LO signal has a frequency of 4.7 MHz. The resulting incident IF signal has a frequency of 100 KHz. Matching the time base signal frequency to the incident IF signal frequency can simplify the circuit diagram, although in other embodiments, the frequencies of the time base signal and incident IF signal need not be matched.

The time base signal further acts as a SYNC signal to a divider 266 of the slave reflectometer 250 to synchronize the LO signal generated from a CLK signal provided by a PLL 264 to the incident IF signal generated by the master reflectometer 200. The RF output signal transmitted by the master reflectometer 200 to the DUT and received at the test port P2 is coupled to a mixer 258 and downconverted by the synchronized LO signal to generate a transmitted IF signal having a phase synchronized with the incident IF signal, enabling the measurement of both magnitude and phase of the S21 parameter.

When the slave reflectometer 250 is switched to act as a transmitter and the master reflectometer 200 is switched to act as a receiver, the time base signal of the master reflectometer acts as a SYNC signal to the pair of dividers 256, 266 of the slave reflectometer 250 to synchronize an LO signal generated from a CLK signal provided by the first PLL 264 to an RF output signal generated from a CLK signal provided by a second PLL 254. The RF output signal is downconverted by the synchronized LO signal at a mixer 258 to generate an incident IF signal having a predictable phase as well as frequency. The time base signal further acts as a SYNC signal to a divider 216 of the master reflectometer 200 to synchronize the LO signal generated from a CLK signal provided by a PLL 214 to the incident IF signal generated by the slave reflectometer 250. The RF output signal transmitted by the slave reflectometer 250 to the DUT and received at the test port P1 is coupled to a mixer 208 and downconverted by the synchronized LO signal to generate a transmitted IF signal synchronized with the incident IF signal, enabling the measurement of both magnitude and phase of the S12 parameter.

Figure 3:
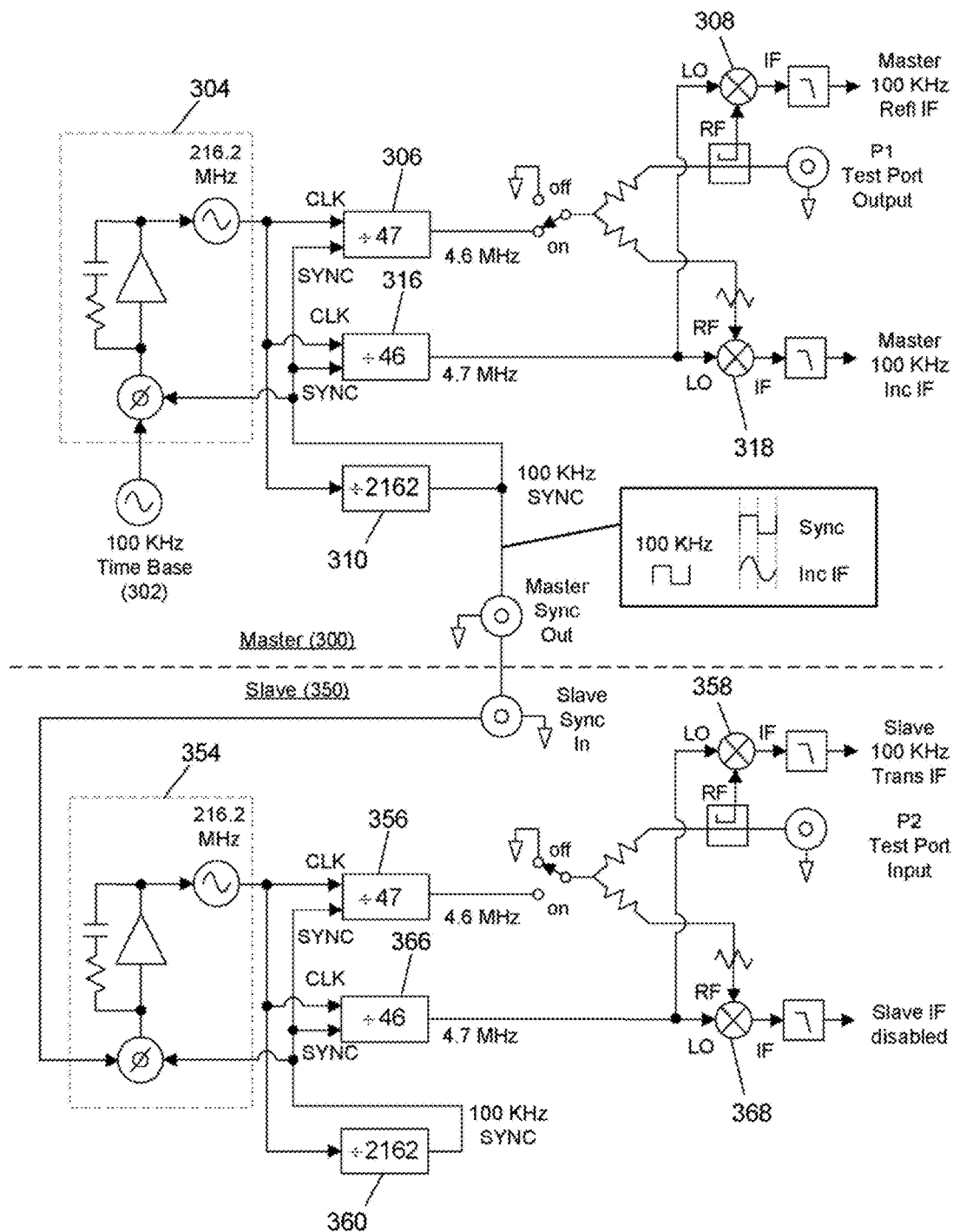
FIG. 3 is a circuit diagram of an alternative embodiment of a system in accordance with the present invention for measuring two port scattering parameters for a device under test.

FIG. 3 is a circuit diagram of an alternative embodiment of a system for measuring S-parameters in accordance with the present invention comprising a first single port reflectometer 300 usable as a master reflectometer and a second single port reflectometer 350 usable as a slave reflectometer. As with the previous embodiment, an RF source of each of the reflectometers 300, 350 is switchably connectable to and disconnectable from a port P1, P2 so that either reflectometer can act as a transmitter while the other reflectometer acts as a receiver. As shown, the master reflectometer 300 is switched to transmit an RF output signal to a DUT (not shown) connected between the test ports P1, P2 while the slave reflectometer 302 is switched to receive the transmitted signal.

The master reflectometer 300 includes a time base signal source 302 that provides a time base signal to synchronize a CLK signal provided by a PLL 304 and a SYNC signal generated by dividing the CLK signal using a CLK divider 310. The SYNC signal is usable by the master reflectometer 300 to synchronize the phase of signals generated by the master reflectometer. The SYNC signal can be passed from the master reflectometer 200 to the slave reflectometer 250 via a cable. As shown, the time base signal and SYNC signal each have a frequency of 100 KHz.

When the master reflectometer 300 is switched to act as a transmitter, the SYNC signal is provided to a pair of dividers 306, 316 to synchronize an LO signal and an RF output signal, both generated from the CLK signal. The RF output signal is downconverted by the LO signal at a mixer 318 to generate an incident IF signal. The RF output signal has a frequency of 4.6 MHz, and the LO signal has a frequency of 4.7 MHz. The resulting incident IF signal has a frequency of 100 KHz. The SYNC signal is passed to the slave reflectometer 350 and usable by the slave reflectometer 350 to synchronize a CLK signal provided by a PLL 354 and a second SYNC signal generated by dividing the CLK signal using a CLK divider 360. The second SYNC signal is provided to a divider 366 of the slave reflectometer 350 to synchronize the LO signal generated from the CLK signal to the incident IF signal of the master reflectometer 300. The RF output signal transmitted by the master reflectometer 300 to the DUT and received at the test port P2 of the slave reflectometer 350 is coupled to a mixer 358 and downconverted by the synchronized LO signal at the mixer 358 to generate a transmitted IF signal synchronized with the incident IF signal, enabling the measurement of both magnitude and phase of the S21 parameter.

When the slave reflectometer 350 is switched to act as a transmitter and the master reflectometer 300 is switched to act as a receiver, the SYNC signal synchronized with the time base signal of the master reflectometer 300 synchronizes a CLK signal provided by a PLL 354 and a second SYNC signal generated by dividing the CLK signal using a CLK divider 360. The second SYNC signal is provided to a pair of dividers 356, 366 of the slave reflectometer 350 to synchronize an LO signal to an RF output signal, both generated from the CLK signal provided by the first PLL 354. The RF output signal is downconverted by the synchronized LO signal at a mixer 258 to generate an incident IF signal having a predictable phase as well as frequency. The SYNC signal synchronized by the time base signal is provided to a divider 316 of the master reflectometer 300 to synchronize the LO signal generated from the CLK signal provided by the PLL 304 to the incident IF signal of the slave reflectometer 350. The RF output signal transmitted by the slave reflectometer 350 to the DUT and received at the test port P1 of the master reflectometer 300 is downconverted by the synchronized LO signal at a mixer 308 to generate a transmitted IF signal having a predictable phase, enabling the measurement of both magnitude and phase of the S12 parameter.

Figure 4:
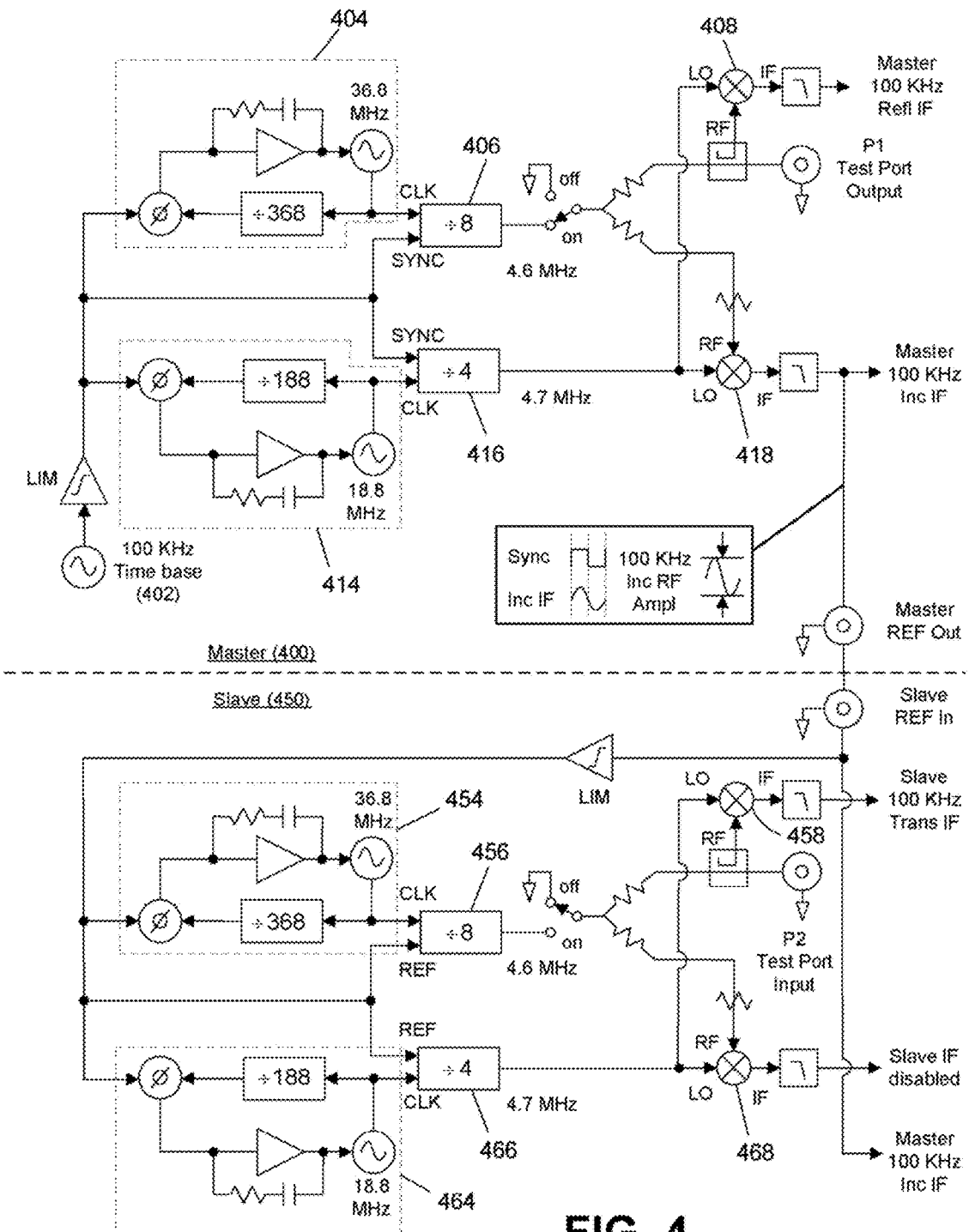
FIG. 4 is a circuit diagram of an alternative embodiment of a system in accordance with the present invention for measuring two port scattering parameters for a device under test.

FIG. 4 is a circuit diagram of an alternative embodiment of a system for measuring S-parameters in accordance with the present invention comprising a first single port reflectometer 400 usable as a master reflectometer and a second single port reflectometer 450 usable as a slave reflectometer. As shown, the master reflectometer 400 is switched to transmit an RF output signal to a DUT (not shown) connected between the test ports P1, P2 while the slave reflectometer 450 is switched to receive the transmitted signal.

The master reflectometer 400 includes a time base signal source 402 that provides a time base signal to synchronize signals generated by the master reflectometer 400. With the master reflectometer 400 switched to act as a transmitter, the time base signal acts as a SYNC signal to a pair of dividers 416, 406 to synchronize an LO signal generated from a CLK signal provided by a first PLL 414 to an RF output signal generated from a CLK signal provided by a second PLL 404. As shown, the PLL oscillator and divider need not be identical between the LO and RF sources. The RF output signal is downconverted by the synchronized LO signal at a mixer 418 to generate an incident IF signal having a predictable phase as well as frequency. As shown, the time base signal has a frequency of 100 KHz, the RF output signal has a frequency of 4.6 MHz, and the LO signal has a frequency of 4.7 MHz. The resulting incident IF signal has a frequency of 100 KHz.

The incident IF signal of the master reflectometer 400 provides a reference (REF) signal to the slave reflectometer 450 to synchronize the signals generated by the reflectometers 400, 450. The amplitude of a transmitted signal can vary for environmental and performance reasons. For example, reflectometers require a warm up period until performance reaches a generally steady state. Warm up periods of 30 minutes are common in commercially available reflectometers. The REF signal varies in amplitude with the transmitted signal so that variation in the transmitted signal can be accounted for when measuring S-parameters.

The REF signal is provided to a divider 466 of the slave reflectometer 450 to synchronize the LO signal generated from a CLK signal provided by a PLL 464 to the incident IF signal of the master reflectometer 400. The RF output signal transmitted by the master reflectometer 400 and received by the slave reflectometer 450 at the test port P2 is coupled to a mixer 458 and downconverted by the synchronized LO signal at the mixer 458 to generate a transmitted IF signal synchronized with the incident IF signal, enabling the measurement of both magnitude and phase of the S21 parameter. Because the incident IF signal of the master reflectometer 400 is used as the REF signal, the RF source of the master reflectometer 400 must be switched to act as a transmitter when used with a slave reflectometer 450 to obtain two port measurements.

Figure 5:
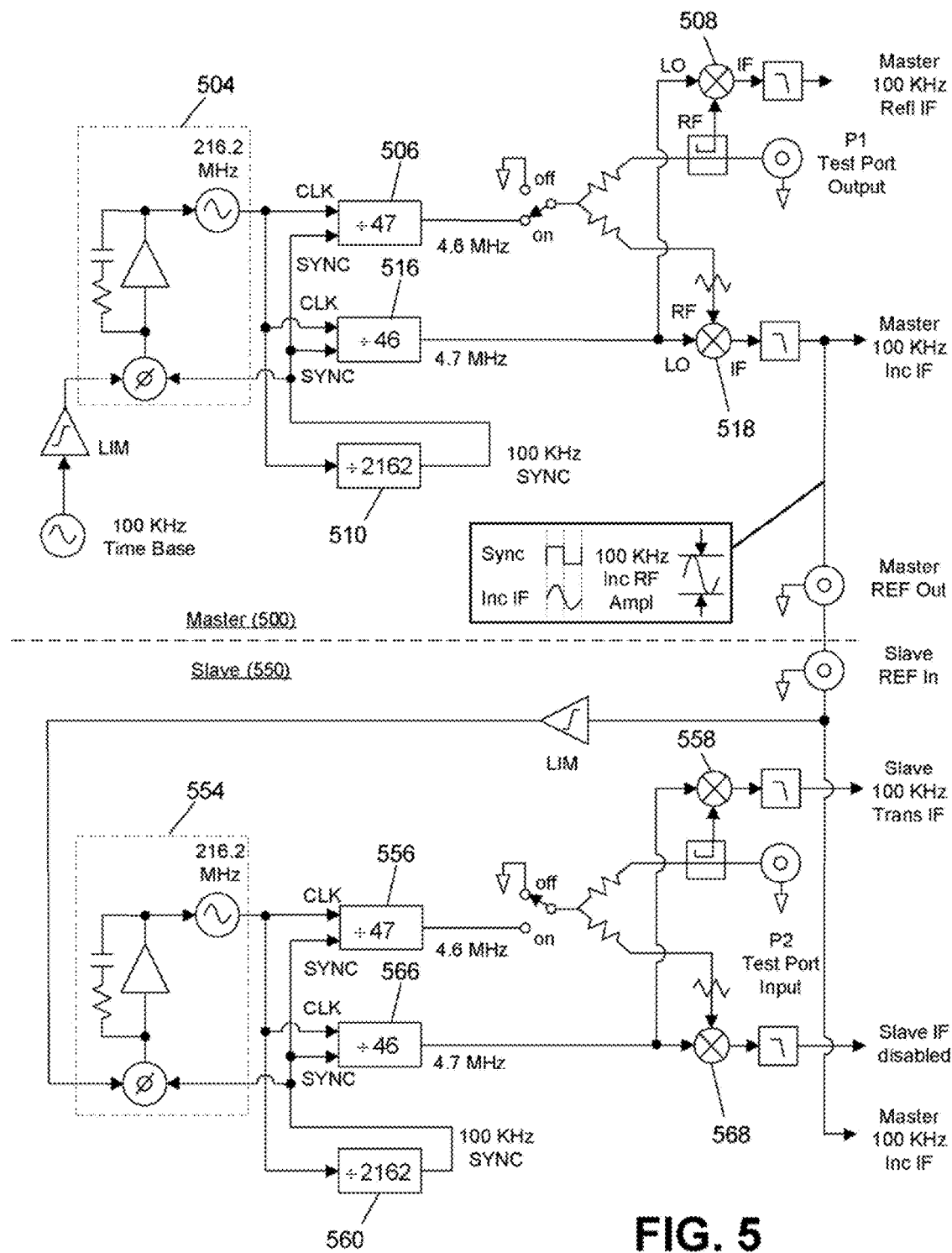
FIG. 5 is a circuit diagram of an alternative embodiment of a system in accordance with the present invention for measuring two port scattering parameters for a device under test.

FIG. 5 is a circuit diagram for an alternative embodiment of a system for measuring S-parameters in accordance with the present invention comprising a first single port reflectometer 500 usable as a master reflectometer and a second single port reflectometer 550 usable as a slave reflectometer. As shown, the master reflectometer 500 is switched to transmit an RF output signal to a DUT connected between the test ports P1, P2 while the slave reflectometer 550 is switched to receive the transmitted signal.

The master reflectometer 500 includes a time base signal source 502 that provides a time base signal to synchronize a CLK signal provided by a PLL 504 and a SYNC signal generated by dividing the CLK signal using a CLK divider 510. The SYNC signal is usable by the master reflectometer 500 to synchronize the signals generated by the master reflectometer 500. As shown, the time base signal and SYNC signal each have a frequency of 100 KHz.

The SYNC signal of the master reflectometer 500 is provided to a pair of dividers 516, 506 to synchronize an LO signal and an RF output signal, both generated from the CLK signal provided by the PLL 504. The RF output signal is downconverted by the synchronized LO signal at a mixer 518 to generate an incident IF signal having a predictable phase as well as frequency. As shown, the RF output signal has a frequency of 4.6 MHz, and the LO signal has a frequency of 4.7 MHz. The resulting incident IF signal has a frequency of 100 KHz. The incident IF signal of the master reflectometer 500 provides a REF signal to the slave reflectometer 550 to synchronize the signals generated by the reflectometers 500, 550. As with the previous embodiment, the REF signal varies in amplitude and frequency with the transmitted signal so that variation in the transmitted signal can be removed when measuring S-parameters.

The REF signal is provided to a PLL 554 of the slave reflectometer 550 to synchronize a CLK signal generated by the PLL 554 and a second SYNC signal generated by dividing the CLK signal using a CLK divider 560. The LO signal is generated from the CLK signal by the divider 566 and synchronized to the incident IF signal of the master reflectometer 500 by the second SYNC signal. The RF output signal transmitted by the master reflectometer 500 and received by the slave reflectometer 550 at the test port P2 is coupled to a mixer 558 and downconverted by the synchronized LO signal at the mixer 558 to generate a transmitted IF signal synchronized with the incident IF signal, enabling the measurement of both magnitude and phase of the S21 parameter. Because the incident IF signal of the master reflectometer 500 is used as the REF signal, the RF source of the master reflectometer 500 must be switched to act as a transmitter when used with a slave reflectometer 550 to obtain two port measurements.

Figure 6:
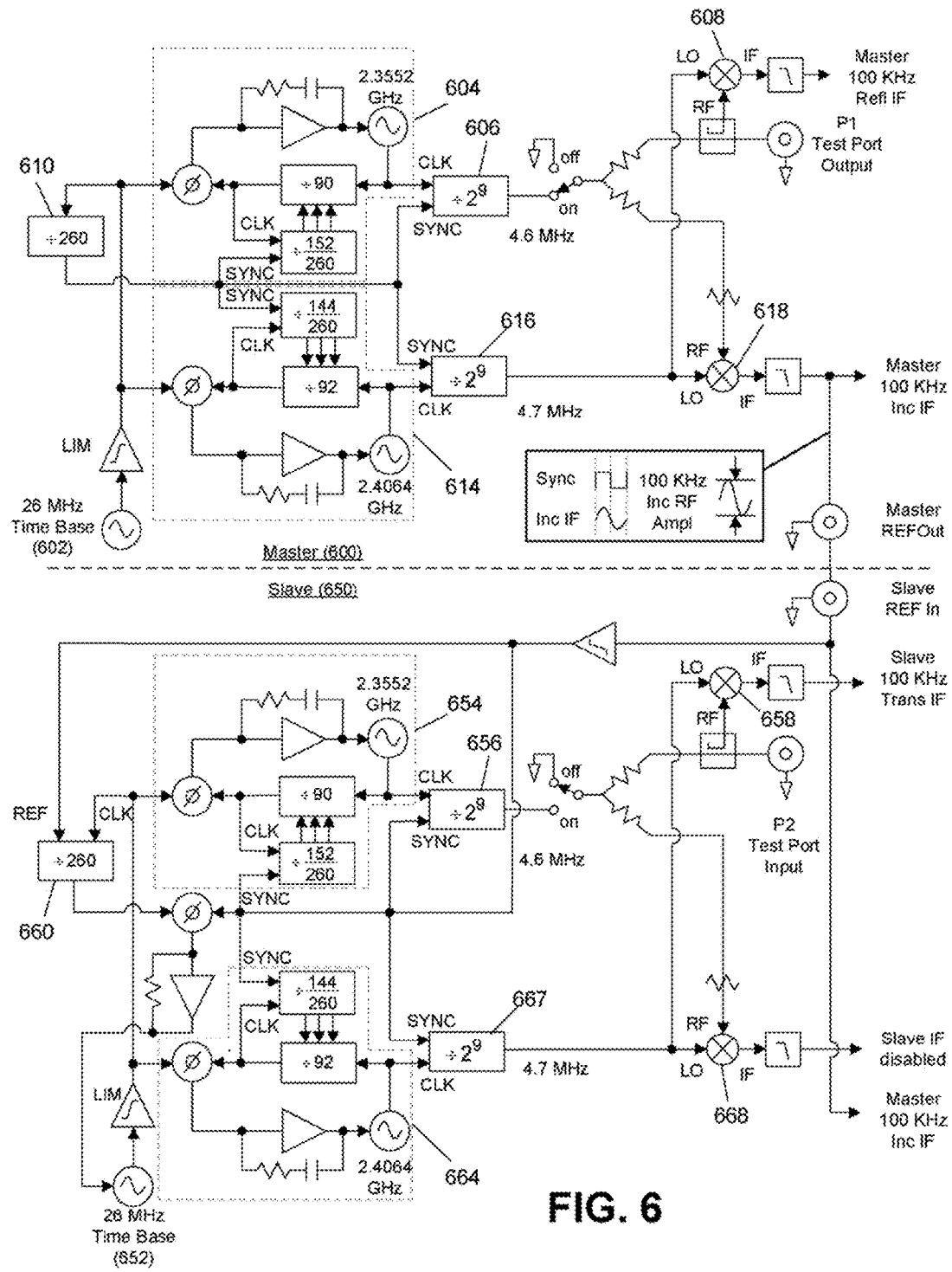
FIG. 6 is a circuit diagram of an alternative embodiment of a system in accordance with the present invention for measuring two port scattering parameters for a device under test.

FIG. 6 is circuit diagram of an alternative embodiment of a system for measuring S-parameters in accordance with the present invention. The system comprises a first single port reflectometer 600 usable as a master reflectometer and a second single port reflectometer 650 usable as a slave reflectometer. The reflectometers each use a high frequency time base signal source 602, 652, such as used by the master reflectometer in FIG. 1B. As shown, the master reflectometer 600 is switched to transmit an RF output signal to a DUT connected between the test ports P1, P2 while the slave reflectometer 650 is switched to receive the transmitted signal.

The master reflectometer 600 includes a time base signal source 602 that provides a time base signal that is used to synchronize CLK signals provided by a pair of PLLs 604, 614 and a SYNC signal generated by dividing the time base signal using a base divider 610. The SYNC signal is usable by the master reflectometer 600 to synchronize the signals generated by the master reflectometer 600. As shown, the time base signal has a frequency of 26 MHz and the SYNC signal has a frequency of 100 KHz.

The SYNC signal is provided to a pair of dividers 616, 606 to synchronize an LO signal generated from a CLK signal provided by the first PLL 614 to an RF output signal generated from a CLK signal provided by the second PLL 604. The RF output signal is downconverted by the synchronized LO signal at a mixer 618 to generate the incident IF signal having a predictable phase as well as frequency. As shown, the RF output signal has a frequency of 4.6 MHz, and the LO signal has a frequency of 4.7 MHz. The resulting incident IF signal has a frequency of 100 KHz, and provides a REF signal to the slave reflectometer 650 to synchronize the signals generated by the reflectometers 600, 650. As with the previous embodiment, the REF signal varies in amplitude and frequency with the transmitted signal so that variation in the transmitted signal can be removed when measuring S-parameters.

Unlike previous embodiments, a time base signal source 652 of the slave reflectometer 650 is used for generating signals. The time base signal source 652 provides a time base signal that is used to synchronize a CLK signals provided by a pair PLL 654, 664 and a second SYNC signal generated by dividing the time base signal using a base divider 660. The REF signal synchronizes the divider 660 of the time base signal to the incident IF signal of the master reflectometer 600. The second SYNC signal is provided to a divider 667 to synchronize an LO signal generated from a CLK signal provided by the first PLL 664 to the incident IF signal of the master reflectometer 600. The RF output signal transmitted by the master reflectometer 600 and received by the slave reflectometer 650 at the test port P2 is coupled to a mixer 658 and downconverted by the synchronized LO signal at the mixer 658 to generate a transmitted IF signal synchronized with the incident IF signal, enabling the measurement of both magnitude and phase of the S21 parameter. Because the incident IF signal of the master reflectometer 600 is used as the REF signal, the RF source of the master reflectometer 600 must be switched to act as a transmitter when used with a slave reflectometer 650 to obtain two port measurements.

Figure 7:
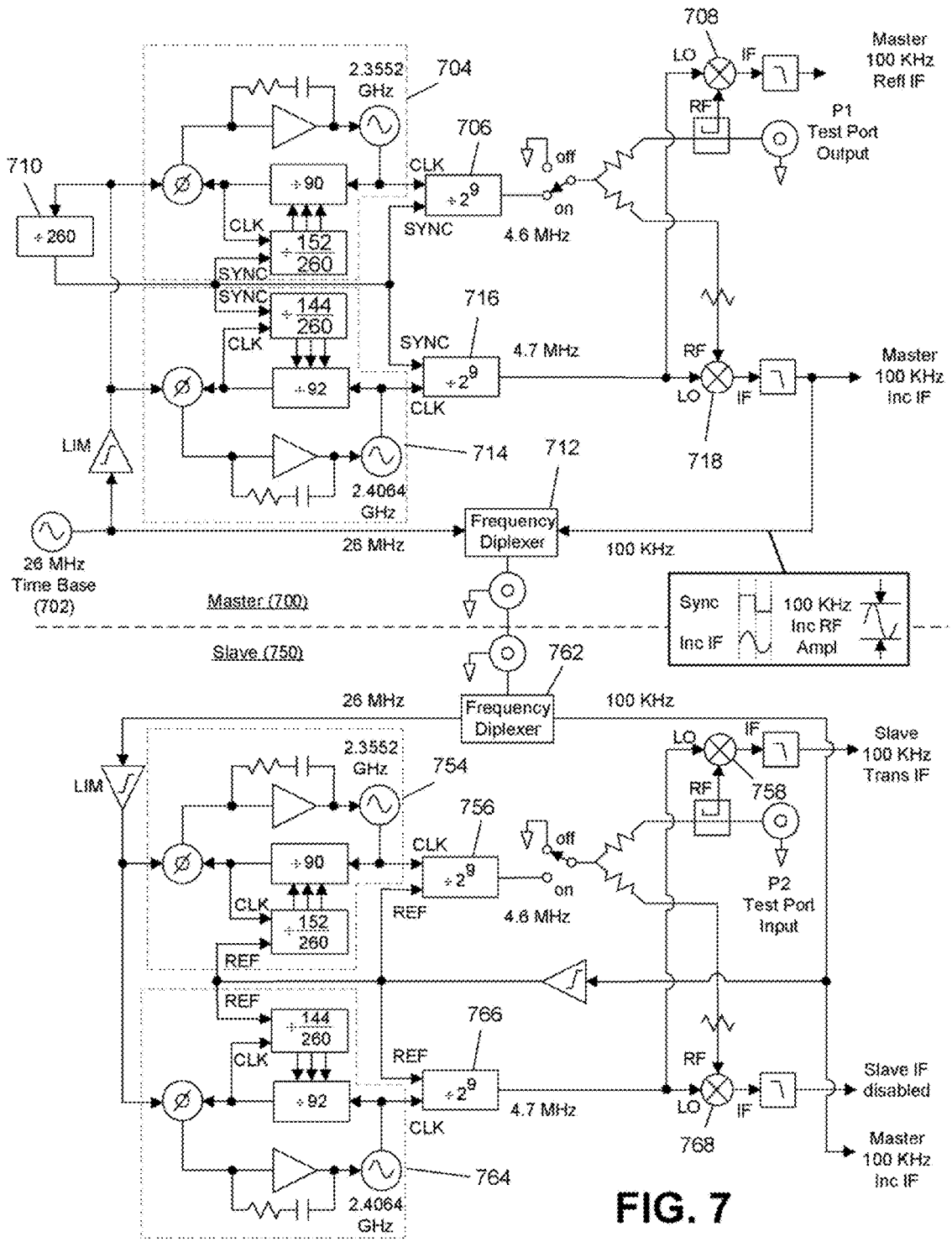
FIG. 7 is a circuit diagram of an alternative embodiment of a system in accordance with the present invention for measuring two port scattering parameters for a device under test.

FIG. 7 is circuit diagram of an alternative embodiment of a system for measuring S-parameters in accordance with the present invention. The system comprises a first single port reflectometer 700 usable as a master reflectometer and a second single port reflectometer 750 usable as a slave reflectometer. The master reflectometer includes a high frequency time base signal source 702, such as used by the master reflectometer in FIG. 1B. As shown, the master reflectometer 700 is switched to transmit an RF output signal to a DUT connected between the test ports P1, P2 while the slave reflectometer 650 is switched to receive the transmitted signal.

The system resembles the system of FIG. 6, but uses frequency diplexers 712, 762 connected, for example via a cable, to provide both a time base signal to synchronize PLLs 704, 714, 754, 764 of the both the master reflectometer 700 and the slave reflectometer 750 and a REF signal provided to the signal dividers 756, 766 of the slave reflectometer. The use of frequency diplexers eliminates the time needed for locking a separate time base signal source for the slave reflectometer 750, thereby substantially reducing the point by point measurement time.

The master reflectometer 700 provides the time base signal that is used to synchronize CLK signals provided by a pair of PLLs 704, 714 and a SYNC signal generated by dividing the time base signal using a base divider 710. The SYNC signal is usable by the master reflectometer 700 to synchronize the signals generated by the master reflectometer 700. As shown, the time base signal has a frequency of 26 MHz and the SYNC signal has a frequency of 100 KHz.

The SYNC signal is provided to dividers of the PLLs and a pair of dividers 716, 706 to synchronize an LO signal generated from a CLK signal provided by the first PLL 714 to an RF output signal generated from a CLK signal provided by the second PLL 704. The RF output signal is downconverted by the synchronized LO signal at a mixer 718 to generate the incident IF signal having a predictable phase as well as frequency. As shown, the RF output signal has a frequency of 4.6 MHz, and the LO signal has a frequency of 4.7 MHz. The resulting incident IF signal has a frequency of 100 KHz and provides a REF signal for the slave reflectometer 750 to synchronize the signals generated by the reflectometers 700, 750. As with the previous embodiment, the REF signal varies in amplitude and frequency with the transmitted signal so that variation in the transmitted signal can be removed when measuring transmission S-parameters S21 and S12.

The time base signal of the master reflectometer 700 is passed to the slave reflectometer 750 to synchronize a PLL 764 of the slave reflectometer 700 to the time base signal. The REF signal is provided to dividers of the PLL 764 and a divider 766 that generates the LO signal from a CLK signal provided by the first PLL 764 to synchronize the LO signal to the incident IF signal of the master reflectometer 600. The RF output signal transmitted by the master reflectometer 600 and received by the slave reflectometer 750 at the test port P2 is coupled to a mixer 658 and downconverted by the synchronized LO signal at the mixer 758 to generate a transmitted IF signal synchronized with the incident IF signal, enabling the measurement of both magnitude and phase of the S21 parameter. Because the incident IF signal of the master reflectometer 700 is used as the REF signal, the RF source of the master reflectometer 700 must be switched to act as a transmitter when used in with a slave reflectometer 700 to obtain two port measurements.

Figure 8:
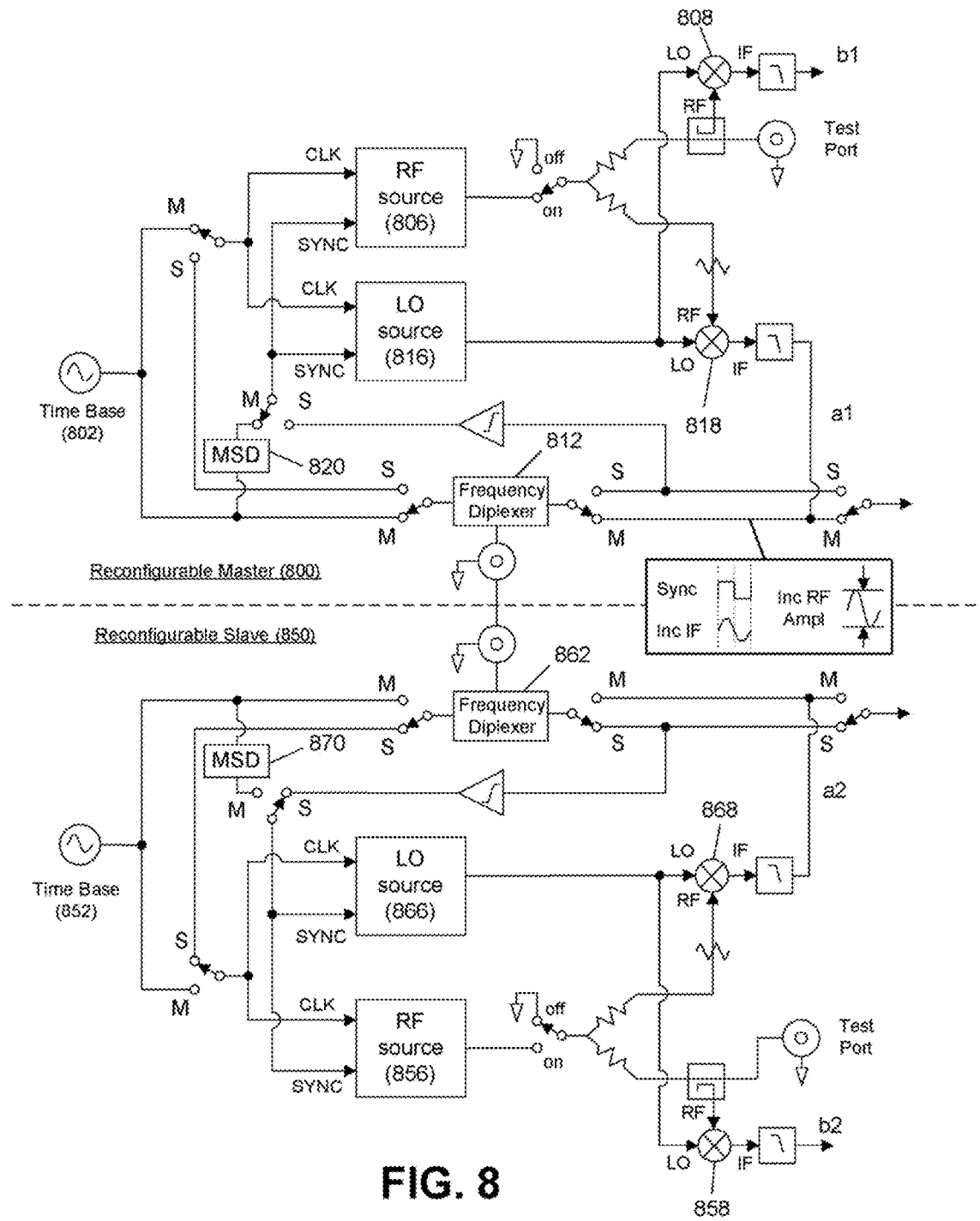
FIG. 8 is a simplified circuit diagram of an alternative embodiment of a system in accordance with the present invention for measuring two port scattering parameters for a device under test.

FIG. 8 is a simplified circuit diagram of an alternative embodiment of a system for measuring S-parameters in accordance with the present invention allowing two reflectometers to be interchangeably used as master and slave reflectometers. The embodiment can allow the sale, for example, of a single stock keeping unit (SKU) for a particular solution. The embodiment can also reduce mismatching of devices at test sites, for example, and allows a purchaser to divide the single port reflectometers up for some tests while combining them for others.

The system comprises a first single port reflectometer 800 configured as a master reflectometer (switch configuration "M") and a second single port reflectometer 850 configured as a slave reflectometer (switch configuration "5"). The RF source 806, 856 and LO source 816, 866 are generalized relative to previous embodiments, as different components can be used to obtain the signals needed to generate a target frequency for an incident IF signal. As shown, the master reflectometer 800 is switched to transmit an RF output signal to a DUT connected between the test ports P1, P2 while the slave reflectometer 850 is switched to receive the transmitted signal.

When the master reflectometer 800 is switched to act as a transmitter, a time base source 802 of the master reflectometer 800 generates a time base signal to synchronize an LO signal generated by the LO source 816 to an RF output signal generated by the RF source 806. The time base signal provides a CLK signal to the RF and LO sources, as well as a SYNC signal generated by a master sync divider (MSD) 820. The RF output signal transmitted by the master reflectometer 800 is downconverted by the synchronized LO signal at a mixer 818 to generate an incident IF signal (a1) having a predictable phase as well as frequency. The time base signal is passed to the slave reflectometer 850 via connected frequency diplexers 812,862 to provide a clock signal to the LO source 866 of the slave reflectometer 850. The incident IF signal generated by the master reflectometer 850 is used as a REF signal and passed to the slave reflectometer 850 via the frequency diplexers 812, 862 to synchronize the LO source 856 to the incident IF signal. The RF output signal transmitted by the master reflectometer 800 to the DUT and received at the test port P2 of the slave reflectometer 850 is coupled to a mixer 818 and downconverted by the synchronized LO signal at the mixer 858 to generate a transmitted IF signal (b2) synchronized with the incident IF signal, enabling the measurement of both magnitude and phase of the S21 parameter (S21=a1).

When the slave reflectometer 850 is switched to act as a transmitter, a time base source 852 of the slave reflectometer 850 generates a time base signal to synchronize an LO signal generated by the LO source 866 to an RF output signal generated by the RF source 856. The RF output signal transmitted by the slave reflectometer 850 is downconverted by the synchronized LO signal at a mixer 868 to generate an incident IF signal (a2) having a predictable phase as well as frequency. The time base signal is passed to the slave reflectometer 850 via connected frequency diplexers 812, 862 to provide a clock signal to the LO source 816 of the master reflectometer. The incident IF signal (a2) generated by the slave reflectometer 850 is used as a REF signal and passed to the master reflectometer 800 via the frequency diplexers 812, 862 to synchronize the LO source 806 to the incident IF signal. The RF output signal transmitted by the slave reflectometer 850 to the DUT and received at the test port P1 of the master reflectometer 800 is coupled to a mixer 808 and downconverted by the synchronized LO signal at the mixer 808 to generate a transmitted IF signal (b1) synchronized with the incident IF signal (a2), enabling the measurement of both magnitude and phase of the S12 parameter (S12=b1/a2).

Figure 9:
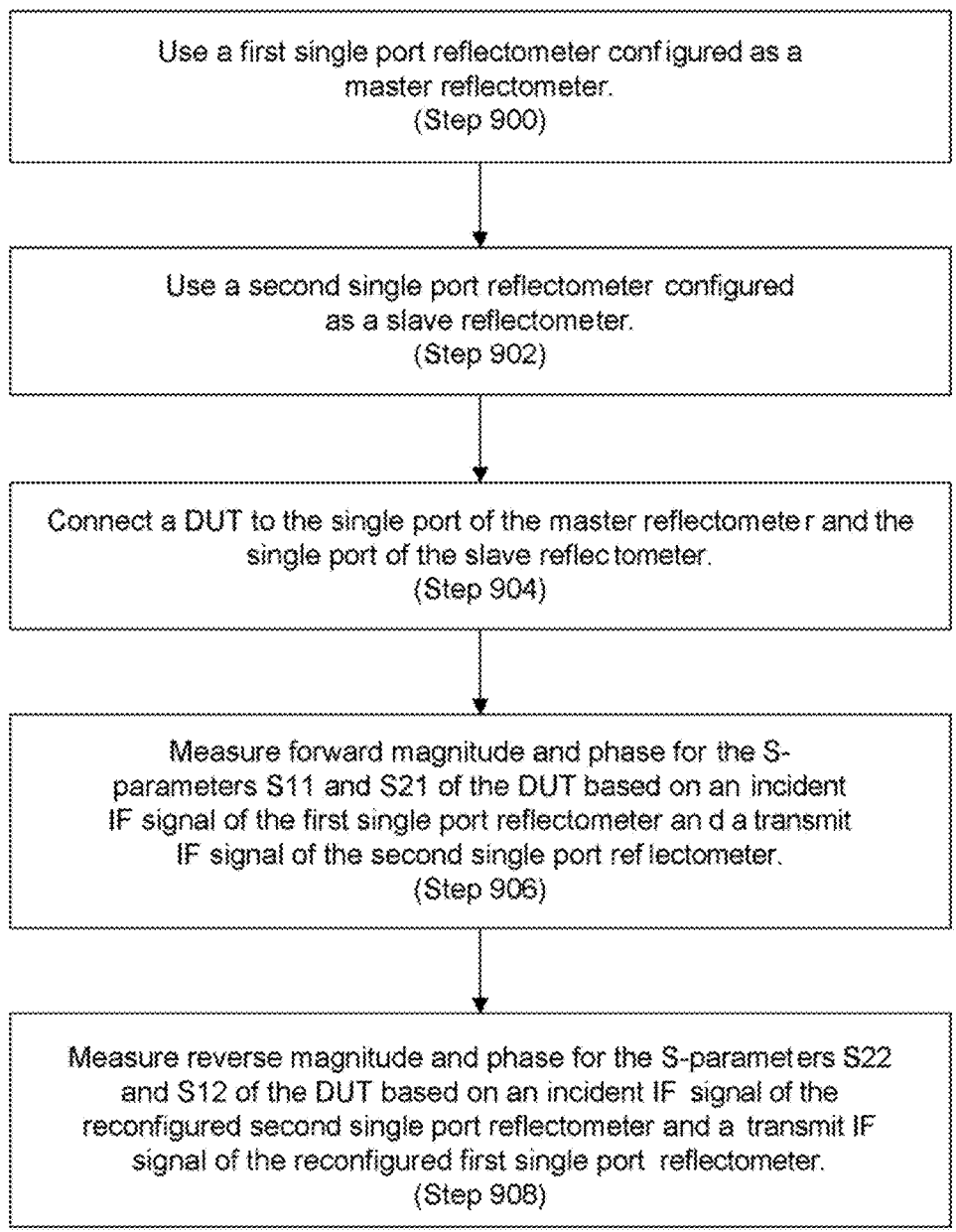
FIG. 9 is a flow diagram of a method for measuring scattering parameters in accordance with the present invention.

FIG. 9 is a flowchart of a method for measuring S-parameter in accordance with the present invention. The method comprises using a first single port reflectometer configured as a master reflectometer (Step 900) and using a second single port reflectometer configured as a slave reflectometer (Step 902). The DUT is connected to the single port of the master reflectometer and the single port of the slave reflectometer (Step 904). The master reflectometer is configured to generate an RF output signal and an LO signal to downconvert the RF output signal to an incident IF signal. The master reflectometer provides a base signal to the slave reflectometer to generate an LO signal to downconvert the RF output signal transmitted by the master reflectometer to the DUT to a transmit IF signal. The master reflectometer further provides a synchronization signal to the slave reflectometer to synchronize the transmit IF signal with the intermediate IF signal. The forward magnitude and phase for scattering parameters S11 and S21 of the DUT can be measured based on the incident IF signal and the transmit IF signal (Step 906).

The method can further comprise reconfiguring the first single port reflectometer and the second single port reflectometer. The reverse magnitude and phase for scattering parameters S22 and S12 of the DUT can be measured based on a second incident IF signal from the reconfigured second single port reflectometer and a transmit IF signal from the reconfigured first single port reflectometer. Reconfiguring can comprise switching the RF source of the second single port reflectometer ON and the RF source of the first single port reflectometer OFF. Reconfiguring can also comprise reconfiguring the first single port reflectometer as the slave reflectometer and the second single port reflectometer as the master reflectometer.

Figure 10:
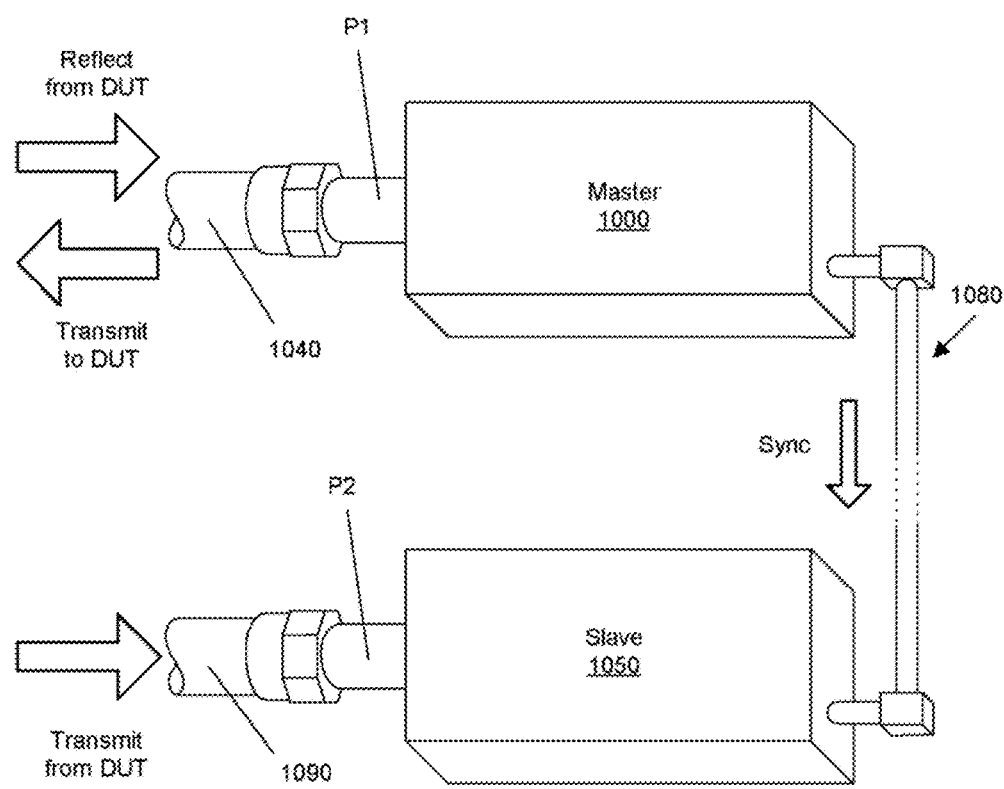
FIG. 10 illustrates an embodiment of a system in accordance with the present invention having a sync signal transmitted from a master reflectometer to a slave reflectometer via a cable.

Referring to FIG. 10, an embodiment of a system in accordance with the present invention is shown having a sync signal (or reference signal) transmitted from a master reflectometer 1000 to a slave reflectometer 1050 via a cable 1080 connected between the master reflectometer 1000 and the slave reflectometer 1050. The cable 1080 can include, for example, a coaxial cable. However, the cable need not be limited to such a medium. Alternatively, the cable can include a propagation medium other than wire, such as the use of air via fiber optics. In still other embodiments, both the master reflectometer and the slave reflectometer can be connected via a cable with a common signal source. A receiver on both reflectometers can be tuned to the common signal to derive a common sync signal. However, in such embodiments, amplitude information cannot be obtained and the common sync signal is synchronized only in phase and not amplitude.

Figure 11:
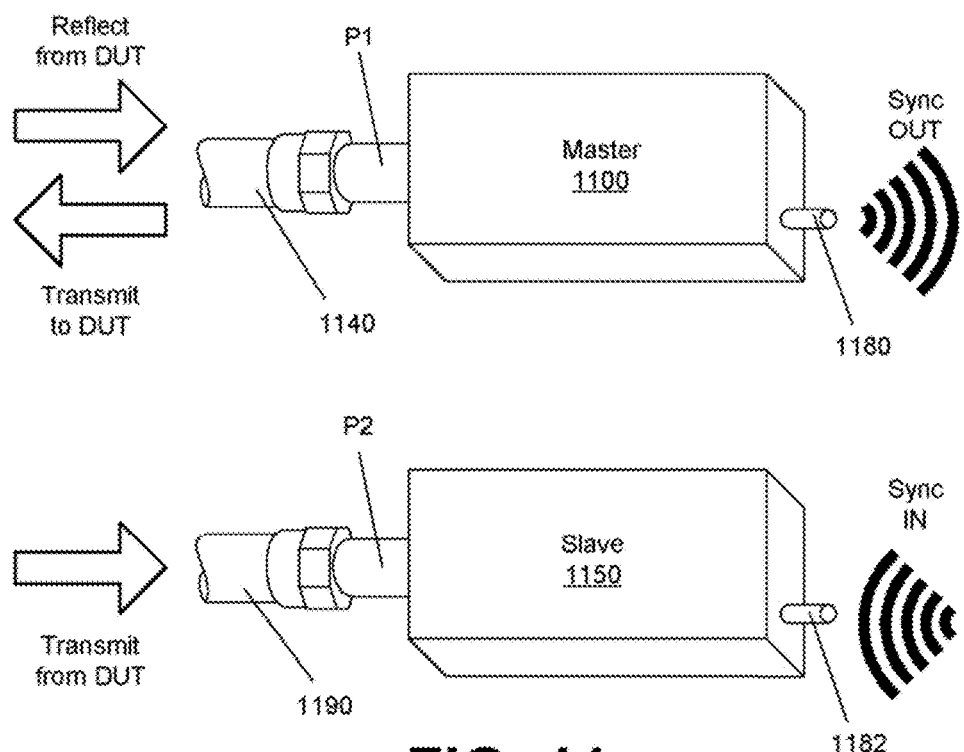
FIG. 11 illustrates an embodiment of a system in accordance with the present invention having a sync signal transmitted from a master reflectometer to a slave reflectometer wirelessly.
Figure 12:
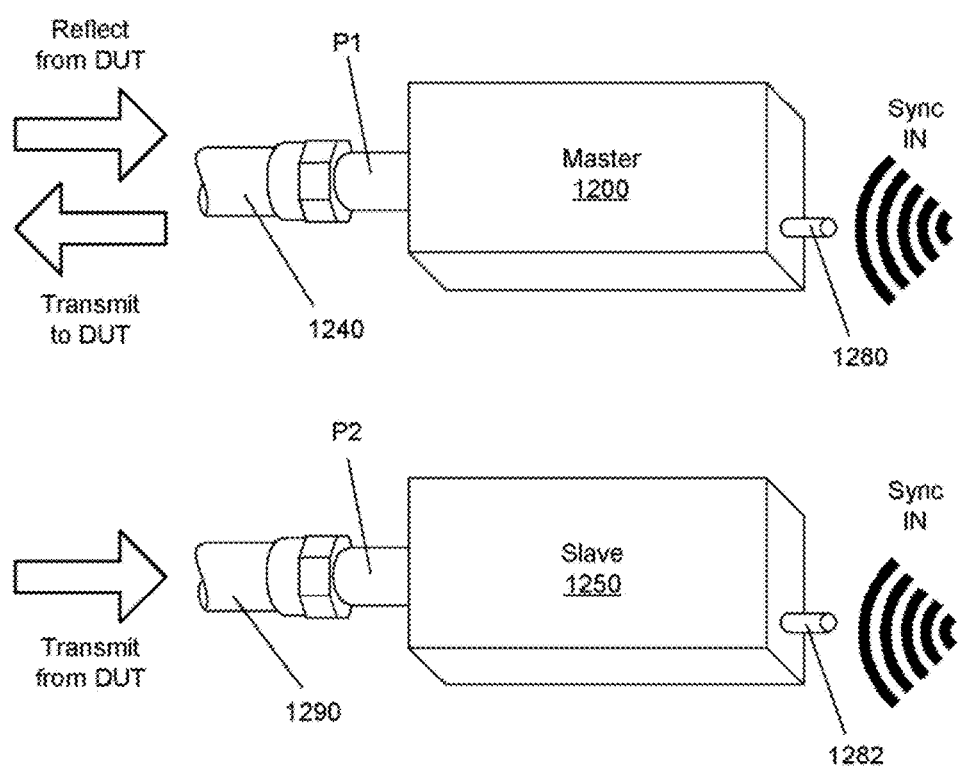
FIG. 12 illustrates an embodiment of a system in accordance with the present invention having a sync signal transmitted to a master reflectometer and to a slave reflectometer wirelessly.

Referring to FIG. 11, an alternative embodiment of a system in accordance with the present invention is shown having a sync signal (or reference signal) transmitted from a master reflectometer to a slave reflectometer wirelessly, and without fiber optics. For example, a sync signal (or reference signal) can be transmitted over the air from the master reflectometer to the slave reflectometer via radio frequency (RF) transmission, line of sight infra-red (IR) transmission, laser transmissions, etc. Referring to FIG. 12, in further embodiments, both the master reflectometer and the slave reflectometer can be connected wirelessly with a common signal source. As above, a receiver on both reflectometers can be tuned to the common signal to derive a common sync signal. However, in such embodiments, amplitude information cannot be obtained and the common sync signal is synchronized only in phase and not amplitude.

The present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A reflectometer for use in measuring scattering (S-) parameters for a device under test (DUT), comprising:
   a test port configured to receive radio frequency (RF) signals and selectively transmit RF signals;
   a first signal source selectively connectable with the test port and configured to provide a test signal to the test port;
   a second signal source configured to provide a local oscillator (LO) signal to downconvert received and transmitted RF signals to intermediate frequency (IF) signals;
   a third signal source configured to generate a time base signal, and
   a synchronization link configured to transmit and receive a synchronization signal;
   wherein in a master configuration, the reflectometer is configured to synchronize the first signal source and the second signal source to a synchronization signal based on the time base signal and to transmit the synchronization signal via the synchronization link;
   wherein in a slave configuration, the reflectometer is configured to receive a synchronization signal via the synchronization link and synchronize the first signal source and the second signal source to the received synchronization signal;
   wherein the reflectometer is adapted to be used as a first reflectometer with a second reflectometer; and
   wherein both phase and magnitude of one or both of an S21 and an S12 parameter of the DUT are measurable when the DUT is connected between the test port of the first reflectometer and a test port of the second reflectometer and the first reflectometer and the second reflectometer are phase synchronized by a common synchronization signal.

2. The reflectometer of claim 1, wherein the synchronization link is a synchronization port and the master reflectometer provides the synchronization signal to the slave reflectometer via a cable connected to the synchronization port.

3. The reflectometer of claim 1, wherein the synchronization link is a wireless connection and the master reflectometer provides the synchronization signal to the slave reflectometer via the wireless connection.

4. The reflectometer of claim 1, wherein the synchronization signal is phase synchronized with an incident IF signal and has an amplitude varying with the incident IF signal, and wherein the synchronization signal is obtained from the incident IF signal.

5. A system for measuring scattering (S-)parameters for a device under test (DUT), comprising:
   a first reflectometer including
      a test port configured to receive signals and selectively transmit signals,
      a first signal source selectively connectable with the test port and configured to provide a radio frequency (RF) test signal to the test port, and
      a second signal source configured to provide a local oscillator (LO) signal to downconvert one or both of a received signal to a received intermediate frequency (IF) signal and the RF test signal to an incident IF signal;
   a second reflectometer including
      a test port configured to receive signals and selectively transmit signals,
      a first signal source selectively connectable with the test port and configured to provide an RF test signal to the test port, and
      a second signal source configured to provide an LO signal to downconvert one or both of a received signal to a received IF signal and the RF output test signal to an incident IF signal;
   wherein the first reflectometer is adapted to be used with the second reflectometer such that the first and second reflectometers are phase synchronized by a synchronization signal; and
   wherein both phase and magnitude of one or both of an S21 and an S12 parameter of the DUT are measurable when the first reflectometer is used in combination with the second reflectometer.

6. The reflectometer of claim 5,
wherein the first reflectometer is adapted to be used as a master reflectometer with the second reflectometer used as a slave reflectometer such that the master reflectometer provides the slave reflectometer with the synchronization signal to phase synchronize signals generated by the slave reflectometer to the incident IF signal; and
wherein both phase and magnitude of an S21 parameter of the DUT are measurable when the reflectometer is used as the master reflectometer in combination with the slave reflectometer.

7. The reflectometer of claim 6, wherein the master reflectometer provides the synchronization signal to the slave reflectometer via a cable connected between ports of the master and slave reflectometers.

8. The reflectometer of claim 6, wherein the master reflectometer provides the synchronization signal to the slave reflectometer via a wireless connection.

9. The reflectometer of claim 5, wherein one or both of the first and second reflectometers further includes
a base signal source configured to provide a base signal,
wherein the first signal source is configured to generate the RF test signal synchronized to the base signal via a first phase lock loop (PLL), and
wherein the second signal source is configured to generate the LO signal synchronized to the base signal via a second PLL.

10. The reflectometer of claim 5, wherein the synchronization signal is phase synchronized with the incident IF signal and has an amplitude varying with the incident IF signal, and wherein the synchronization signal is obtained from the incident IF signal.

11. A reflectometer for use in measuring scattering (S-) parameters for a device under test (DUT), comprising:
a test port configured to receive and transmit radio frequency (RF) signals;
a test signal source selectively connectable with the test port and configured to provide a test signal to the test port;
a local oscillator (LO) signal source configured to provide a LO signal for downconverting RF signals to intermediate frequency (IF) signals; and
a synchronization link configured to transmit and receive a synchronization signal;
wherein in a master configuration, the test signal source and the LO signal source are synchronized to a synchronization signal generated by the reflectometer and the synchronization signal is transmitted via the synchronization link;
wherein in a slave configuration, a synchronization signal is received via the synchronization link and the test signal source and the LO signal source are synchronized to the received synchronization signal;
wherein the reflectometer is adapted to be used as a first reflectometer with a second reflectometer; and
wherein phase for one or both of an S21 parameter and an S12 parameter for the DUT is measurable when the DUT is connected between the test port of the first reflectometer and a test port of the second reflectometer and the first reflectometer and the second reflectometer are phase synchronized by a common synchronization signal.

12. The reflectometer of claim 11, further comprising:
a time base signal source configured to generate a time base signal; and
wherein the synchronization signal generated by the reflectometer is synchronized to the time base signal.

13. The reflectometer of claim 11, further comprising:
a time base signal source configured to generate a time base signal; and
wherein the synchronization signal is the time base signal.

14. The reflectometer of claim 11, wherein the synchronization link is a synchronization port and the master reflectometer provides the synchronization signal to the slave reflectometer via a cable connected to the synchronization port.

15. The reflectometer of claim 14, wherein the cable is one of a coaxial cable and a fiber optic cable.

16. The reflectometer of claim 11, wherein the synchronization link is a wireless connection and the master reflectometer provides the synchronization signal to the slave reflectometer via the wireless connection.

17. The reflectometer of claim 11,
wherein the first reflectometer and the second reflectometer receive a common signal from a common signal source; and
wherein a receiver of each of the first and second reflectometers generates the synchronization signal from the common signal.

18. The reflectometer of claim 11, wherein the synchronization signal is phase synchronized with an incident IF signal and has an amplitude varying with the incident IF signal, and wherein the synchronization signal is obtained from the incident IF signal.

19. The reflectometer of claim 11, further comprising:
a time base signal source configured to generate a time base signal,
wherein the test signal source is configured to generate the test signal synchronized to the time base signal via a first phase-locked loop (PLL), and
wherein the LO signal source is configured to generate the LO signal synchronized to the time base signal via a second PLL.

20. The reflectometer of claim 11, further comprising:
a time base signal source configured to generate a time base signal; and
a phase-locked loop (PLL) connected with the time base signal source,
wherein the test signal source is configured to generate the test signal synchronized to the time base signal via the PLL, and
wherein the LO signal source is configured to generate the LO signal synchronized to the time base signal via the PLL.

* * * * *